United States Patent [19]

Whitely

[11] 4,254,469
[45] Mar. 3, 1981

[54] METHOD AND APPARATUS FOR OFFSET ERROR CORRECTION

[75] Inventor: Robert M. Whitely, Dayton, Ohio

[73] Assignee: NCR Corporation, Dayton, Ohio

[21] Appl. No.: 16,677

[22] Filed: Mar. 1, 1979

[51] Int. Cl.³ .............................................. G06F 15/46
[52] U.S. Cl. ........................... 364/571; 340/146.3 SY
[58] Field of Search ....... 364/571, 466, 567, 146.3 SY

[56] References Cited

U.S. PATENT DOCUMENTS

| | | | |
|---|---|---|---|
| 3,510,696 | 5/1970 | Bargen et al. ................. | 364/571 X |
| 3,557,353 | 1/1971 | Allen et al. ..................... | 364/466 |
| 3,584,204 | 6/1971 | Susor ............................... | 364/466 |
| 3,916,173 | 10/1975 | Williams, Jr. et al. ......... | 364/571 X |
| 3,939,332 | 2/1976 | Williams, Jr. et al. .......... | 364/567 |
| 3,959,769 | 5/1976 | Sternberg et al. ......... | 340/146.3 SY |
| 4,031,630 | 6/1977 | Fowler ........................... | 364/571 X |
| 4,035,769 | 7/1977 | Sternberg et al. ......... | 340/146.3 SY |
| 4,043,412 | 8/1977 | Rock ............................... | 177/25 |
| 4,055,748 | 10/1977 | Boshinski et al. ............. | 364/466 |
| 4,070,900 | 7/1978 | Engels ............................ | 73/1 B |
| 4,080,657 | 3/1978 | Caldicott et al. ............... | 364/567 |
| 4,139,069 | 2/1979 | Domis et al. ................... | 364/567 X |
| 4,139,892 | 2/1979 | Gudea et al. ................... | 364/567 |
| 4,140,874 | 2/1979 | Thomas .......................... | 178/88 |
| 4,144,578 | 3/1979 | Mueller et al. ................. | 364/571 X |
| 4,158,396 | 6/1979 | Suzuki et al. .................. | 364/567 X |
| 4,161,700 | 7/1979 | Fujikata et al. ................ | 364/571 X |
| 4,162,531 | 7/1979 | Rode et al. ..................... | 364/571 |

Primary Examiner—Edward J. Wise
Attorney, Agent, or Firm—J. T. Cavender; Albert L. Sessler, Jr.

[57] ABSTRACT

A method and apparatus for correction of null or zero reference offset error occurring in a measuring or transducing device by reason of temperature change, component ageing or other effects. A system including an appropriately programmed microcomputer, an analog-to-digital converter, a digital-to-analog converter and an operational amplifier provides a closed feedback correction loop, controlled by the microcomputer, which can maintain the zero adjustment of an analog transducer and amplifier circuitry over an indefinite period of time.

22 Claims, 7 Drawing Figures

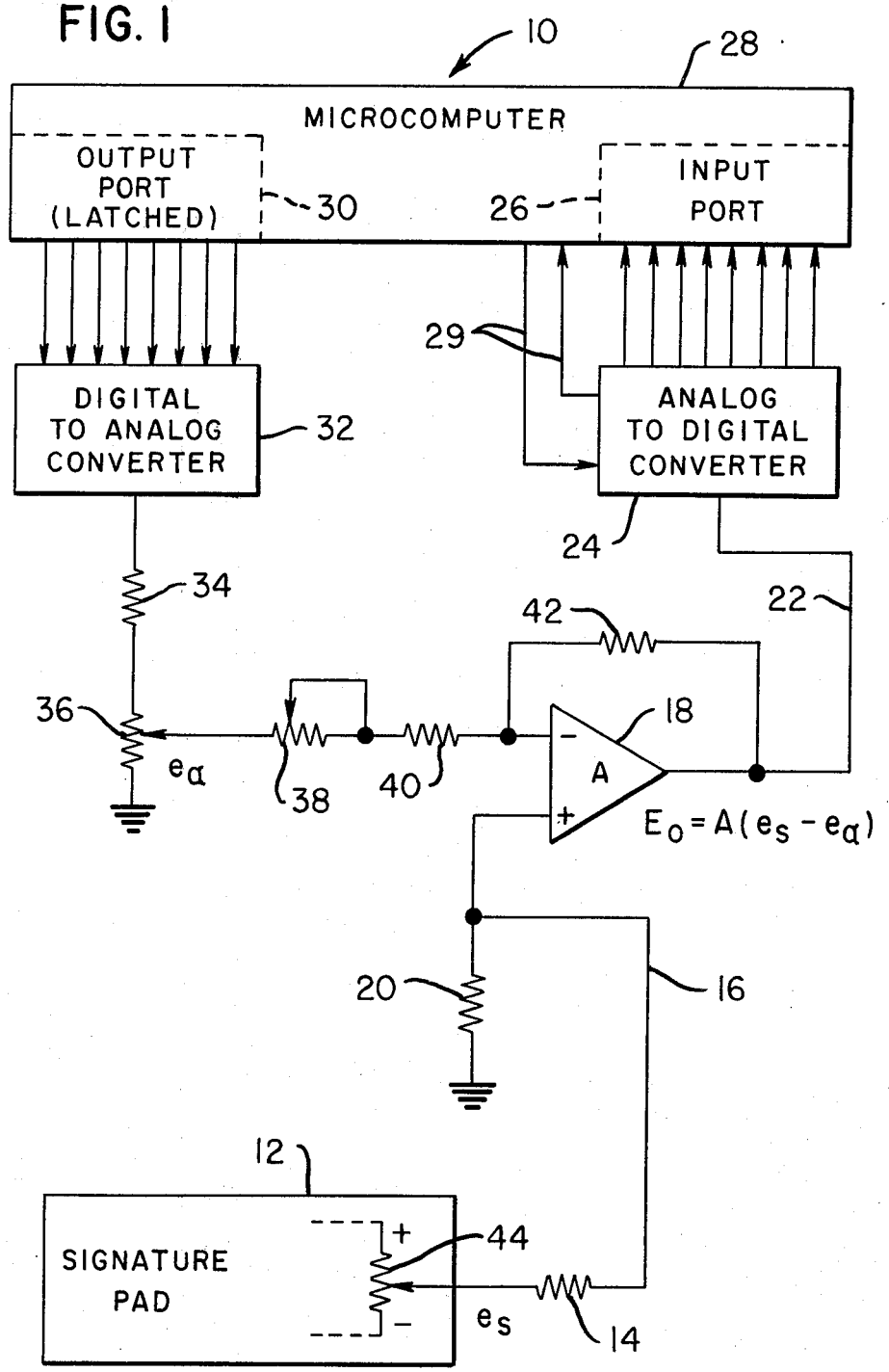

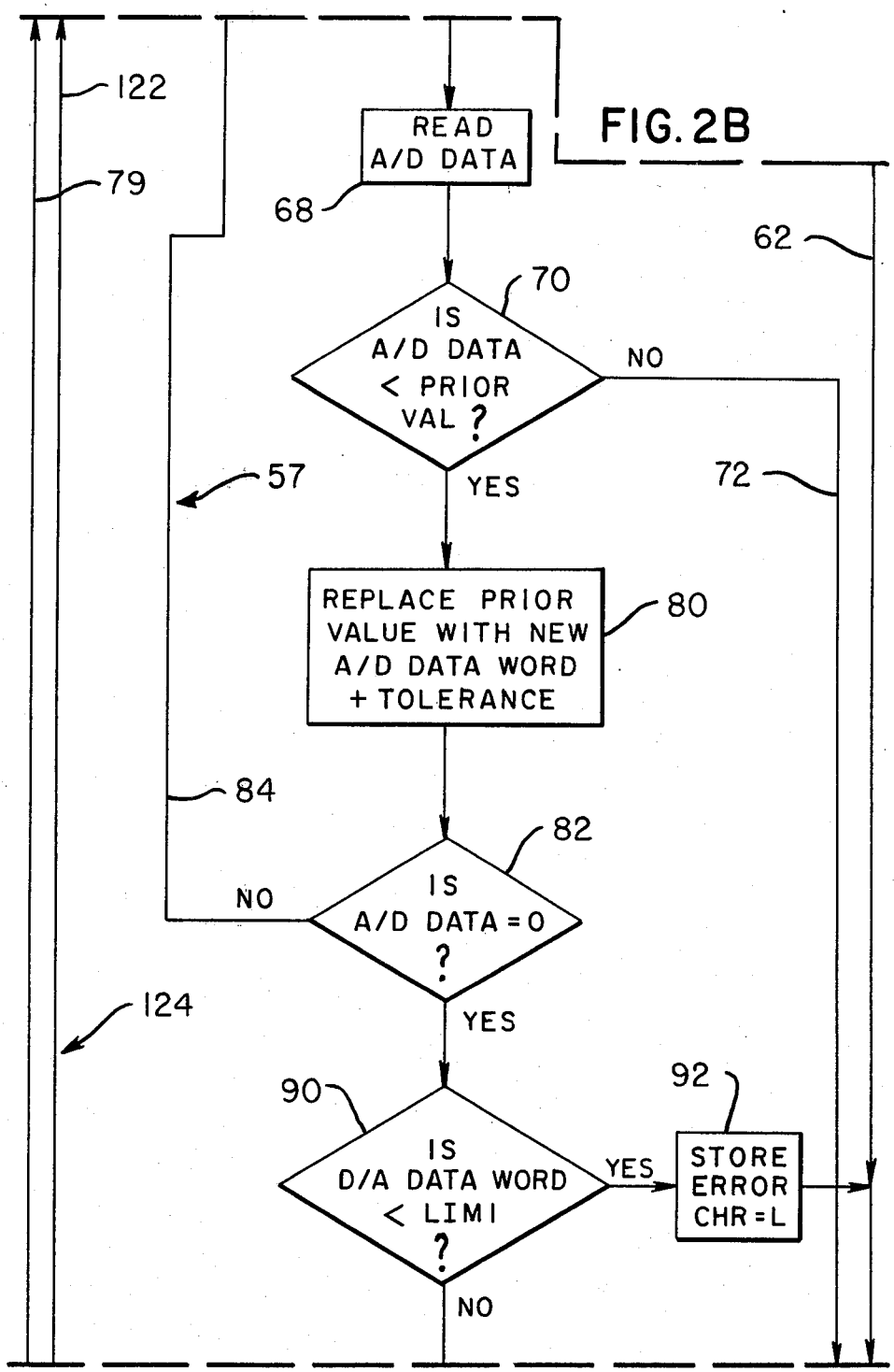

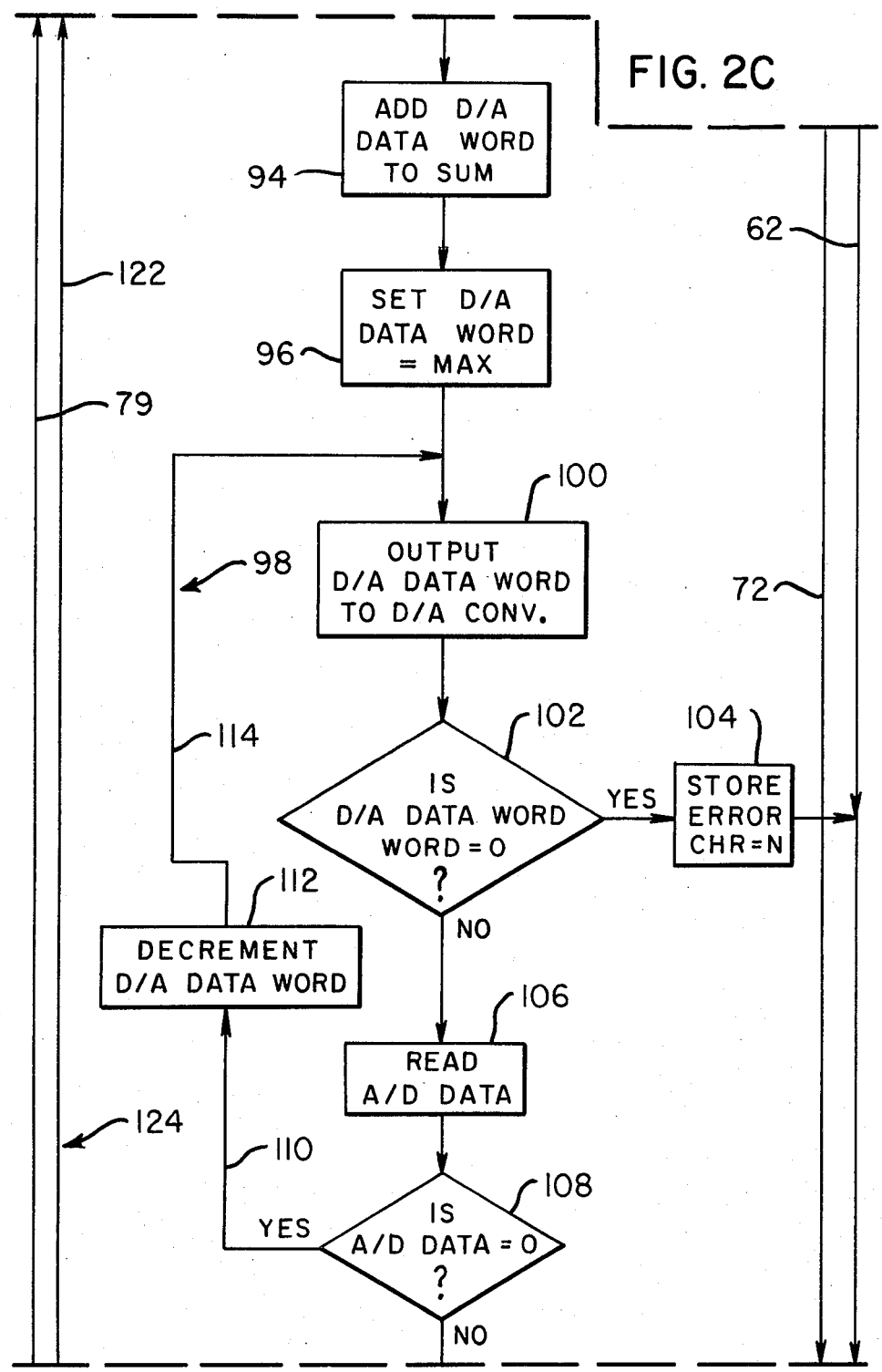

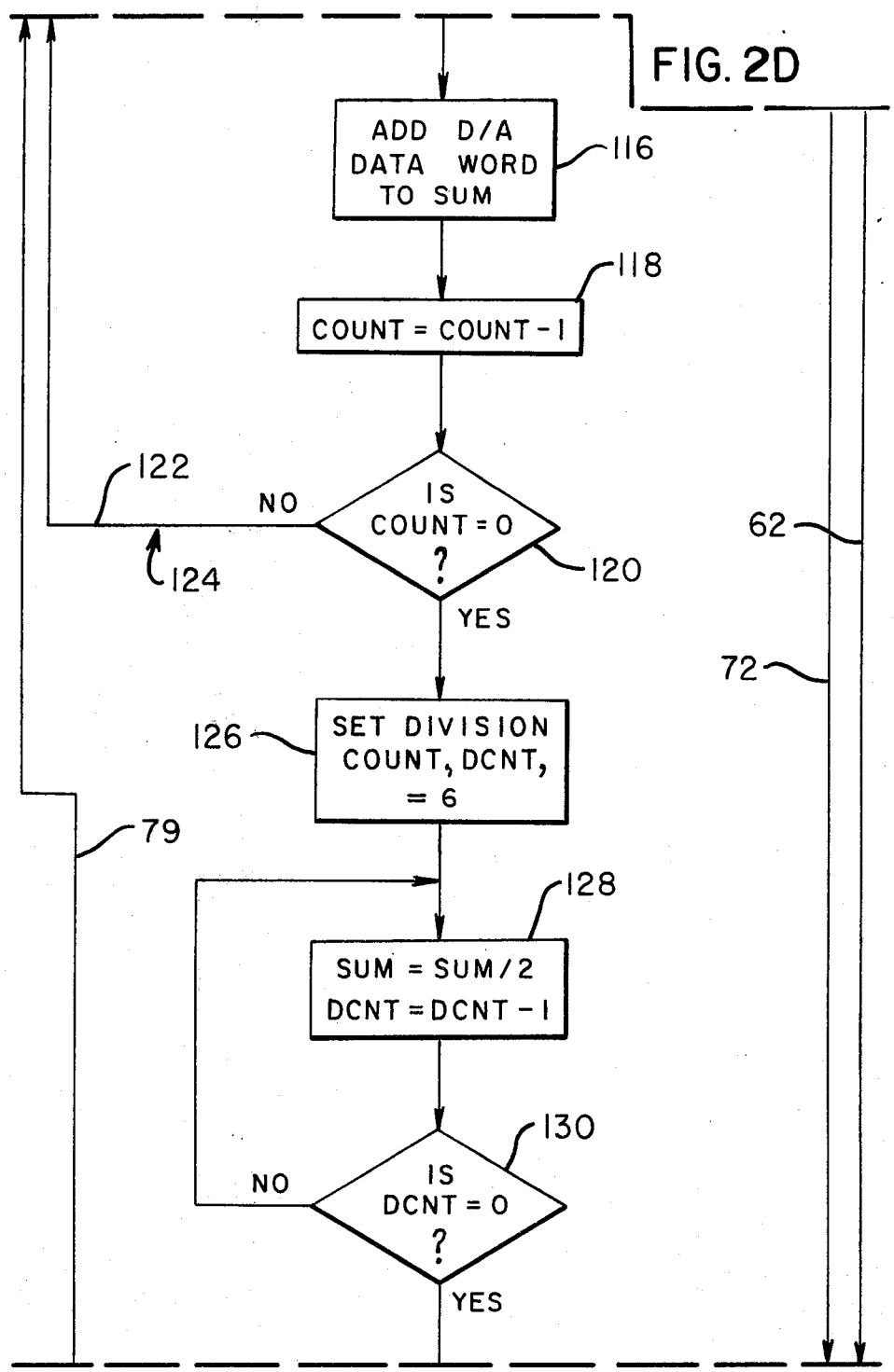

METHOD AND APPARATUS FOR OFFSET ERROR CORRECTION

BACKGROUND OF THE INVENTION

Drifting of the null or zero point in various types of transducing or measuring devices used in such applications as weighing scales and signature verification systems is well-known. Such a null or zero reference drift is intolerable in the case of remote unattended installations of such devices and systems as mentioned above, since frequent manual adjustments cannot be made in such remote installations. Various automatic means for compensating such offset errors have been developed, and function, in general, by virtue of careful attention to design, utilization of high-grade low-drift components, and suitable inclusion of compensation components exhibiting complementary drift characteristics. Such means generally function entirely within the analog signal domain, are costly and achieve varying degrees of success due to component tolerances.

In the case of hybrid computational systems, such as signature verification systems, which embrace both analog and digital signal domains, utilization of available digital components in large part already present in the system offers the opportunity for the provision of accurate, efficient and inexpensive drift compensation means.

SUMMARY OF THE INVENTION

This invention relates to a method and apparatus for correction of null or zero reference offset error, and more particularly relates to a method and apparatus for correction of null or zero reference offset error resulting from drift of the null point of the output signal of a measuring or transducing device such as, for example, a signature pad utilized in a signature verification system.

In accordance with one embodiment of the invention, apparatus for compensating for drift from a null point of a measuring device comprises comparison means for comparing a first signal from said measuring device with a derived second signal and for providing an output signal representative of the difference between said first and second signals; analog-to-digital converter means to which said output signal is applied, for providing a digital equivalent of said output signal; digital-to-analog converter means for providing said second signal to said comparison means; and data processing means coupled to said analog-to-digital converter means and to said digital-to-analog converter means, and operable in an iterative operation to generate a compensating value which, when applied to said digital-to-analog converter means, results in said second signal having a predetermined relationship to said first signal, said compensating value being generated in a plurality of inerations commencing from a predetermined initial value by incrementing said digital-to-analog converter means to change the magnitude of said second signal until said output signal applied to said analog-to-digital converter means by said comparison means attains a predetermined value.

In accordance with another embodiment of the invention, a method for compensating for drift from a null point of a measuring device comprises the steps of comparing a measurement output signal from said measuring device with a compensating signal; providing a comparison output signal representative of the difference between said measurement output signal and said compensating signal; comparing said comparison output signal with a previous comparison output signal; modifying the compensating signal by a predetermined amount in the event of a given result of the comparison of the preceeding step; and repeating all of the preceding steps with successive modifications of said compensating signal until said comparison output signal attains a predetermined value.

It is accordingly an object of the present invention to provide a method and apparatus for compensating for drift from a null point of a measuring device.

Another object is to provide accurate, efficient and inexpensive drift compensation method and means for the signature pad of a signature verification system.

An additional object is to provide a drift compensation system comprising an appropriately-programmed microcomputer, an analog-to-digital converter, a digital-to-analog converter and an operational amplifier in a closed feedback correction loop configuration.

A further object is to provide a method for drift compensation comprising use of a compensation signal to offset a signal representing drift from a null point, modification of said compensation signal by successive measurements of the difference between the drift signal and the compensation signal, and incrementally modifying said compensation signal after each measurement until a desired difference value of the difference signal is obtained.

A further object is to provide diagnostic means for detecting malfunctions of the drift compensation means.

With these and other objects, which will become apparent from the following description, in view, the invention includes certain novel features and combinations of parts, a plurality of embodiments of which are hereinafter described with reference to the drawings which accompany and form a part of this specification.

BRIEF DESCRIPTION OF THE DRAWINGS

FIG. 1 is a block diagram showing the hardware components of the offset error correction system of the present invention.

FIGS. 2A–2F inclusive taken together from a detailed flow diagram showing the operation of the system.

DESCRIPTION OF THE PREFERRED EMBODIMENT

Figure 2A:
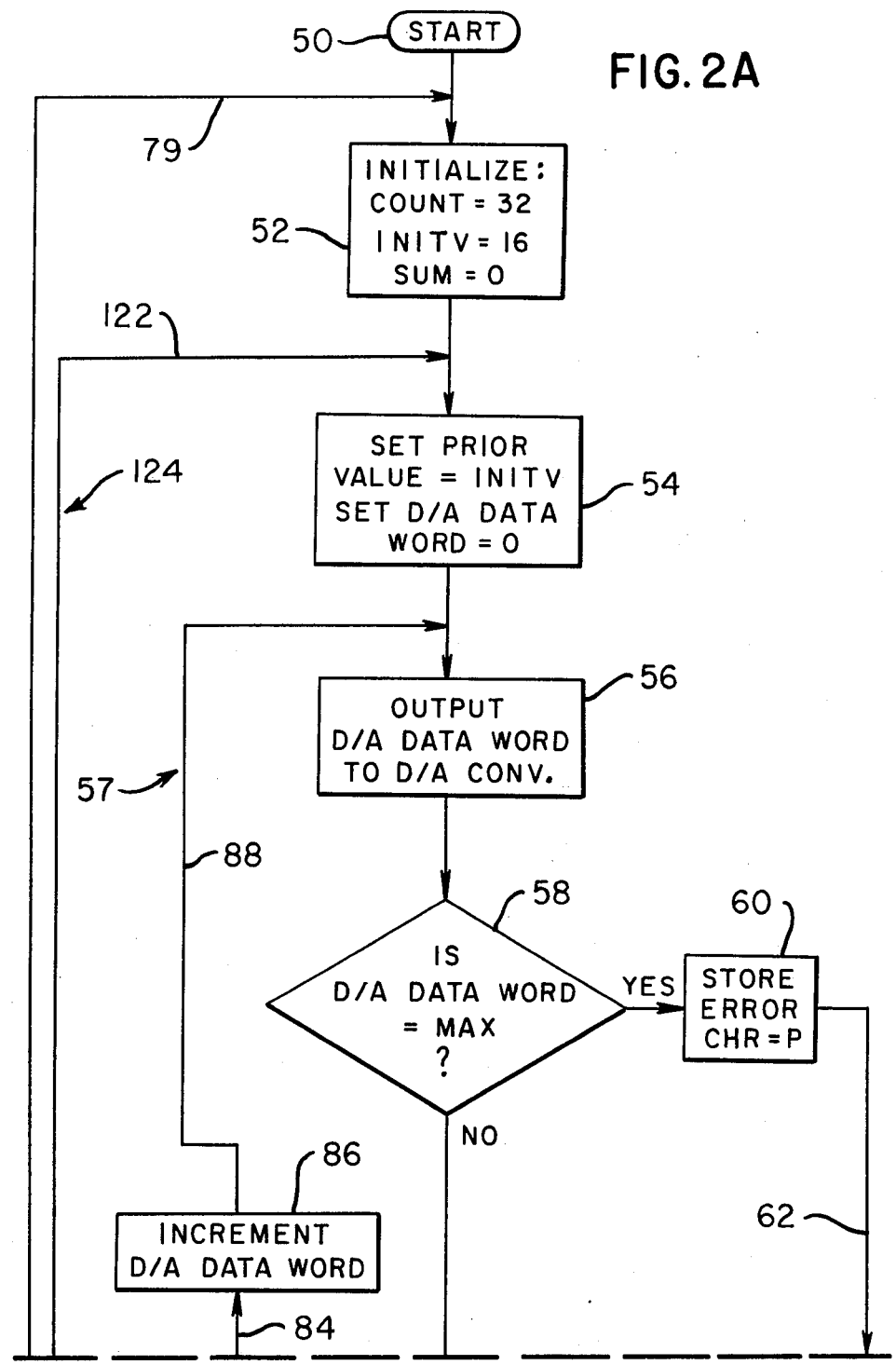

Referring to FIG. 1, a system 10 embodying the present invention is shown. In the illustrated embodiment, the drift compensation system is applied to a writing table transducer or signature pad 12 which is utilized to generate a signal or waveform representative of the varying forces applied by a person in writing predetermined data, such as a signature. A plurality of waveforms so generated, representing a corresponding plurality of signatures, are used to produce a reference, which can then be utilized in verification of the authenticity of the identity of the same person in the future by comparison of a similar sample with the reference. One suitable form of the table 12 is shown in co-pending United States Patent Application Ser. No. 889,766, inventor Donald W. Baver et al., filed Mar. 24, 1978, now U.S. Pat. No. 4,143,357, issued Mar. 6, 1979, and assigned to the assignee of the present application. The specific component types and values set forth herein for the various elements of the system are those used in the illustrated embodiment, but other appropriate types and values could be employed if desired.

An output signal $e_s$ from the signature pad 12 is applied through a 10,000-ohm resistor 14 and a path 16 to the non-inverting input of an operational amplifier 18, which may be a National Semiconductor type 308. The path 16 is connected to a base reference potential, shown as ground, through a 1-megohm resistor 20.

The output of the amplifier 18 is connected over a path 22 to the input of an analog-to-digital converter 24 which may be of type ADC82AG manufactured by Burr-Brown Research Corporation. This is an eight-bit converter, which is connected for a 0 to +10v. input range. It is coupled to an input port 26 of a microcomputer 28, which may be an Intel SBC80/10, and controlled by the microcomputer via lines 29. An output port 30 of the microcomputer 28 is coupled to an eight-bit unipolar digital-to-analog converter 32 which may be a Precision Monolithics type DAC-03BD. The output of the converter 32 is connected through a 100,000-ohm fixed resistor and a 100-ohm variable resistor 36 to a base reference potential, shown as ground. A further path extends from the slide of the variable resistor 36 through a 5,000-ohm variable resistor 38 and an 8,200-ohm fixed resistor 40 to the inverting input of operational amplifier 18. A 1-megohm fixed resistor 42 is connected in a path between the inverting input and the output of operational amplifier 18.

It may be seen that the analog voltage output of the digital-to-analog converter 32 is reduced in amplitude by the voltage divider comprising the resistor 34 and the trimmer potentiometer 36. This reduced voltage, designated as $e_a$, is applied through the gainsetting resistors 38 and 40 to the inverting input of the amplifier 18, while the analog output voltage $e_s$ of the signature pad 12 is applied to the non-inverting input of said amplifier.

The analog output voltage $E_o$ of the operational amplifier 18 is given approximately by $$E_o = A(e_s - e_a)$$

where A represents the amplification factor.

For the resistor values cited above for resistors 38, 40 and 42, the amplification factor of the operational amplifier circuit is approximately 100.

From the above equation, it will be seen that the voltage $E_o$ can be reduced to zero amplitude by suitable adjustment of the voltage $e_a$, such that $e_a$ is approximately equal to $e_s$. Since the value of the voltage $e_a$ is derived from the output of the digital-to-analog converter 32, which is controlled by the associated microcomputer 28 in a manner which will subsequently be described, means are thus provided for automatic correction of any drift of the voltage $e_s$ away from the ideal "null" state in which it should repose when no writing pressure is applied to said pad.

The output voltage $e_a$ of the digital-to-analog converter 32 is reduced to a suitable level by the previously-mentioned voltage divider comprising the resistor 34 and the trimmer potentiometer 36. The setting of this potentiometer establishes the "step resolution" value of the adjustment voltage $e_a$; that is, the actual change in voltage $e_a$ which is produced by a single unit of incremental change in the digital value applied to the converter 32 by the microcomputer 28 through the output port 30. This setting represents a compromise between fineness of null adjustment and magnitude of the maximum drift of the signature pad 12 which can be corrected by the system, and thus sets a limit on the adjustment range.

The trimmer potentiometer 36 is initially adjusted such that $E_o$ varies approximately four millivolts for each incremental change of the digital data word applied to the input of the digital-to-analog converter 32. For this adjustment setting, the maximum, range of adjustment of $E_o$ is slightly in excess of 1 volt as the digital data word which is applied by the microcomputer 28 through the output port 30 to the digital-to-analog converter 32 is varied from 0 to its maximum value which, for an eight-bit word, is 255 decimal or FF hexadecimal. Once this adjustment has been made, the input word to the digital-to-analog converter 32 is set by the microcomputer 28 to a midscale value of 128 decimal (80 hexadecimal). Next, with no force being applied to the signature pad 12, its output balance potentiometer 14 is adjusted to bring the amplifier output voltage $E_o$ to a "null" value (i.e. 0 volts). At this time the voltage $e_s$ is at an amplitude of about +5 millivolts, and the amplitude of the voltage $e_a$ is also at a value of approximately 5 millovolts. Now, by varying the value of the digital input word which is applied to the digital-to-analog converter 32, the output voltage $E_o$ can be adjusted over a range of + or −0.5 volt (500 millivolts) about the null point, so long as the voltage $e_s$ is held constant at 5 millivolts. The output voltage $E_o$ of the operational amplifier 18 is converted to a digital value by the analog-to-digital converter 24 and is input to the microcomputer 28 through the input port 26. In this manner, the microcomputer 28, under appropriate software program control which will subsequently be described, can monitor the status of the null point and can correct for drift by modifying the value of the digital data word which is applied through the output port 30 to the digital-to-analog converter 32. The digital data word which is applied from the output port 30 to the converter 32 is latched or held in said port and continuously applied to the converter 32 until such time as a decision is made in the microcomputer that a change in value should be made in order to correct the drift. As will subsequently be seen, a number of measurements are taken of the value $E_o$ in order to obtain a number of data word values, from which an average is then taken and utilized during the sensing of a signature by the signature pad 12. As implemented in the signature verification system, the null drift of the signature pad 12 may be measured and corrected immediately prior to the making of each signature.

The method by which the microcomputer 28 functions to correct the null drift and to provide the desired compensating data word value is best explained by reference to the flow diagrams of FIGS. 2A, 2B, 2C, 2D, 2E and 2F.

Referring now to FIG. 2A, the drift compensating process is commenced at an appropriate time during overall signature verification system operation by the System Executive Program, as indicated by block 50. A loop counter COUNT is initialized to a value of 32; an initial value INITV is set to 16; and a totalizing counter SUM is cleared to 0 in starting the program, all as shown in block 52. These designated quantities may be stored in appropriate register or memory locations. A COUNT value of 32 is selected arbitrarily as a suitable total number of positive and negative loop samples from which an average may be derived, with each of the 32 iterations including both a positive and a negative loop sample, for a total of 64 samples. Other values than 32 would be suitable and can be selected. However, selection of a power of 2 simplifies the division procedure to be subsequently discussed, so that ideally COUNT should be selected from among the numbers 2, 4, 8, 16, 32, 64, etc. The division process which is used for derivation of an average can be conveniently accomplished in the microcomputer of the illustrated example simply by shifting right the contents of a register an appropriate number of times.

The INITV value of 16 is selected to provide a suitable initial magnitude for the PRIOR VALUE parameter which is subsequently used in the program for evaluating each analog-to-digital data word generated. The totalizing counter SUM is set to 0 in preparation for accumulating a total which is used in establishing the average digital-to-analog data word value.

The process next proceeds to block 54, in which the PRIOR VALUE register is set to the INITV magnitude and the digital-to-analog control register, representing the data word value, is set equal to 0. It should be noted that these values could be retained in memory locations rather than in registers, if desired, at the expense of increased execution time. The microcomputer employed in the illustrated embodiment of the system contains a sufficient number of registers to permit the dedication of two of said registers for these parameters.

Continuing, as shown in block 56, the digital-to-analog data word held in the digital-to-analog control register is outputted to the digital-to-analog converter 32. It will be seen that block 56 is the first block in a loop 57 in which the digital-to-analog data word is successively incremented in value. For the first iteration of this loop 57, the digital-to-analog data word is 0, resulting in an analog voltage output of $e_a$ of 0 volts. This causes the output $E_o$ of the amplifier 18 to be set to some positive value of output voltage as determined by the previously-mentioned equation: $E_o = A(e_s - e_a)$.

Next in the process, the digital-to-analog data word is tested to determine whether or not it is at its maximum value of 255 decimal (FF hexadecimal), as shown in decision block 58. This maximum value condition cannot exist for a properly-adjusted and normally-functioning system, which has been initially set with the input word to a mid-scale value of 128 decimal, as previously described. However, in the event of certain malfunctions, such as excessive offset voltage $e_s$ from the signature pad 12 or a burnout failure of the digital-to-analog converter 32, the loop 57 commencing with block 56 will be traversed 255 times without resulting in proper adjustment of the voltage $e_a$. In such case, the "Yes" exit from the decision block 58 is taken; an error character, shown in the illustrated embodiment as the ASCII code "P", is stored in a reserved memory location, as represented by block 60; and path 62 is taken to an ABORT routine, represented by blocks 64 and 66 in FIG. 2F, in which a flag is set in block 64 to indicate that a hardware failure has occurred. The ABORT condition may optionally be handled in a suitable manner by the Executive Program; for example, the host computer may be notified of the failure. It should be noted that this is a fatal or catastrophic failure mode and that attempts to utilize the system 10 must be prevented until the malfunction has been serviced. Storage of the unique error character "P" is useful in diagnostic analysis.

Returning to FIG. 2A, and assuming that the data word test is successful so that the "No" exit from decision block 58 is taken, the analog-to-digital data output word representing the value of $E_o$ is read into the microcomputer 12 from the analog-to-digital converter 24 through the input port 26, as represented by block 68 (FIG. 2B). The new analog-to-digital data word is then compared to the PRIOR VALUE, as indicated in decision block 70. Normally the new data word will be less than the PRIOR VALUE (or the initial value INITV for the first pass through the loop 57), because the voltage $E_o$ will normally successively decrease as the digital-to-analog converter output is increased one step value for each pass through the loop 57.

If the new analog-to-digital data value is greater than the prior value, this indicates that some other factor is responsible, such as, for example, an increased force being improperly applied to the signature pad 12 by a customer seeking to establish his or her identity. In such case, the "No" exit is taken from the decision block 70, and path 72 is followed to a routine comprising blocks 74, 76, 78 (FIG. 2F), wherein an error indicator lamp may be flashed or an audible tone sounded until the fault clears or a time-out occurs. The warning continues over loop 75 for so long as the system continues to determine, as shown by decision block 77, that the analog-to-digital data word is not less than the initial value INITV, or until some other limit has been reached in accordance with the programming of the system. Exit from the loop 75 occurs when it is determined in decision block 77 that the analog-to-digital data word is less than the initial value INITV. This will normally take place when the improperly-applied force is removed from the signature pad 12. In such case, the system returns via the "Yes" exit from block 77 over path 79 to block 52 (FIG. 2A).

If the system is operating normally, and the "Yes" exit from block 70 is taken, the PRIOR VALUE is replaced with the new analog-to-digital data value as shown in block 80. In addition to this, a small tolerance factor must be added to the analog-to-digital data value stored at this time, because an AC ripple component may be present in the output voltage $E_o$ of the amplifier 18. Addition of this tolerance factor is easily accomplished by incrementing the PRIOR VALUE register. Three such incrementing operations are carried out in the illustrated embodiment, though a different tolerance magnitude could be selected if desired.

Proceeding with system operation, in block 82 the analog-to-digital data word is tested, and if it is not equal to 0, the "No" exit is taken, and path 84 is followed to block 86, where the digital-to-analog data word held in the digital-to-analog control register is incremented one step, and operation continues from block 86 over path 88 to the previously-mentioned block 56 for a further traverse of the loop 57. If the analog-to-digital data word is 0, the loop 57 is exited via the "Yes" exit of block 82.

Next, in decision block 90, another diagnostic test is made to detect the instance in which either the circuitry of the signature pad 12 has failed or the power to the signature pad 12 has been interrupted. A test limit value LIM1 is arbitrarily set relatively low (e.g. 10 decimal or 0A hexadecimal). In block 90, if the digital-to-analog data word is less than LIM1, the "Yes" exit is taken, the ASCII character for "L" is stored in the error character memory location, as indicated in block 92, and path 62 is followed to the ABORT routine. Here again, the error condition is fatal, and system operation must be suspended until maintenance is performed.

Next, assuming that the normal "No" exit is taken from decision block 90, the digital-to-analog data word held in the digital-to-analog control register is added to the totalized SUM being maintained in a register pair of the system microcomputer (specifically the H and L register pair in the illustrated embodiment), as shown in block 94 of FIG. 2C.

In block 96, the digital-to-analog data word held in the digital-to-analog control register is set to the maximum value of 255 decimal (FF hexadecimal) prior to entering a second adjustment loop 98. This loop, which might be termed the N loop, controls the digital-to-analog converter such that the null point of the amplifier output voltage $E_o$ is approached from the region in which $E_o$ values are of negative polarity, in contrast to the first loop 57 described previously, which can be termed the P loop, wherein the null point is approached from the region in which $E_o$ is of positive polarity.

The use of the two loops 57 and 98 is based upon the results of experimentation, and the desire to enhance accuracy to the maximum possible extent. For a system in which a less rigorous standard of accuracy is acceptable, the P loop only could be utilized. In fact, an operative system could be provided in which no averaging operation, such as will subsequently be described, takes place, and in which the data word value is determined simply by a series of operations of the P loop in which the output $E_o$ is ultimately set by incrementation off the digital-to-analog register 32 to a value which results in a zero output voltage $E_o$ when the signature pad 12 is at rest. In the illustrated embodiment however, the system incorporates both the P and N loops, and exhibits accuracy of a higher degree than that which could be obtained by using only one loop or by not performing the averaging operation.

The reason why greater accuracy is obtained by use of both the P and N loops is believed to be due largely to the asymmetrical ripple component present on the amplifier output voltage $E_o$. This ripple component arises from deliberate minimal filtering of the demodulator utilized in the force-to-voltage transducer circuitry of the signature pad 12 with which the present invention is utilized in the illustrated embodiment. The degree of filtering represents a design trade-off between dynamic response times of the transducer output voltage and the ripple amplitude. The asymmetry of the ripple waveform results from diode mismatch in the transducer demodulator, and its nature may be expected to differ from unit to unit. Thus, it is believed that incorporation of the P and N loops provides a means for attaining minimal error regardless of individual variations in component values in the other portions of the system with which the present invention is utilized.

Continuing now with the description of the system, in block 100 (FIG. 2C) the digital-to-analog data word is outputted to the digital-to-analog converter. Block 100 is the initial block in the N loop 98, and it will be seen that the digital-to-analog converter voltage during the operation of this loop commences at its maximum value and decreases incrementally in stairstep fashion until the loop exit decision condition is satisfied. It will be remembered from the previous discussion that exactly the opposite occurs in the P loop 57, in which the digital-to-analog converter voltage starts at 0 and increases toward its maximum value.

Continuing with the process, in decision block 102, the digital-to-analog data word is tested for 0. If the data word is equal to 0, implying a circuit failure, the "Yes" exit from block 102 is taken, and ASCII character "N" (denoting the N loop 98) is stored in the error character memory location, as represented in block 104, and path 62 is followed to the ABORT routine, represented by blocks 64, 66 (FIG. 2F).

Assuming that the normal "No" exit is taken from the decision block 102, the analog-to-digital data word is read as shown in block 106, and tested for 0 in decision block 108. In considering the operation of the N loop 98, it should be noted that since the signature pad 12 of the illustrated embodiment produces a unipolar voltage waveform, the analog-to-digital converter 24 utilized therewith is of the positive polarity type. This converter translates all negative polarity voltage values to a 0 value digital word. Therefore, exit from the N loop 98 via the "No" exit of the decision block 108 takes place during the first iteration of the loop 98 in which the analog-to-digital data word output exceeds 0. Such iteration is the one during which the magnitude of the digital-to-analog data word has been decremented sufficiently that the corresponding voltage output $e_a$ applied to the inverting input of the amplifier 18 results in an output from said amplifier which is sufficient to produce an output from the analog-to-digital converter 24 of a value of 1 or more; that is, when the least significant bit of the word output from the analog-to-digital converter 24 becomes true (logical 1). For the eight-bit analog-to-digital converter used in the system of the illustrated embodiment, this occurs when output $E_o$ slightly exceeds 39 millivolts.

For as long as the analog-to-digital data word remains 0, the "Yes" exit over path 110 from decision block 108 is taken, the digital-to-analog data word is decremented by one bit (thus decreasing the digital-to-analog converter output voltage by one step value) in block 112, and the program remains in the N loop 98, returning over path 114 to block 100. Once the analog-to-digital data word becomes non-zero, the "No" exit from block 108 is taken and the digital-to-analog data word is added to the SUM, block 116 (FIG. 2D).

In block 118, the loop counter COUNT is decremented by 1 and is tested for 0 in decision block 120. The loop counter was originally initialized, as described previously, for a count of 32 decimal at the beginning of the operation.

By following path 122 from the "No" exit of block 120, it may be seen that the loop counter COUNT is counting the iterations of an outer loop 124 which encloses the P loop 57 and the N loop 98. For each pass through this outer loop 124, two values of the digital-to-analog data word are determined, one by the P loop 57 and one by the N loop 98. These values are then accumulated in the totalizer SUM. Therefore, for an outer loop count of 32, a total of 64 values are accumulated, necessitating division by 64 to obtain an average value for the digital-to-analog data word. This division is performed in blocks 126, 128 and 130 by six right shifts of the register pair (H and L in the illustrated embodiment) containing the SUM, as determined by the division count, or DCNT.

Figure 2E:
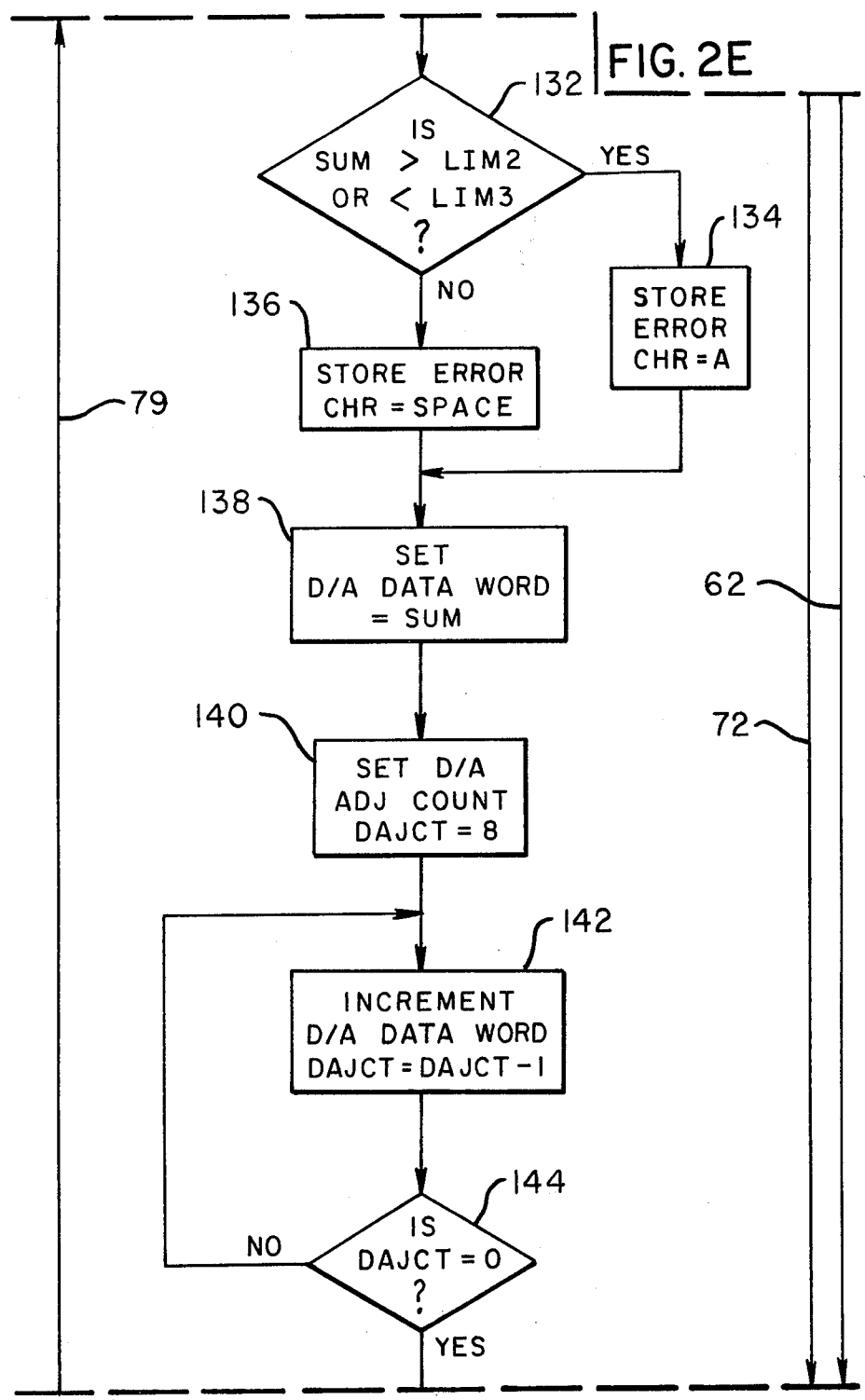
Figure 2F:
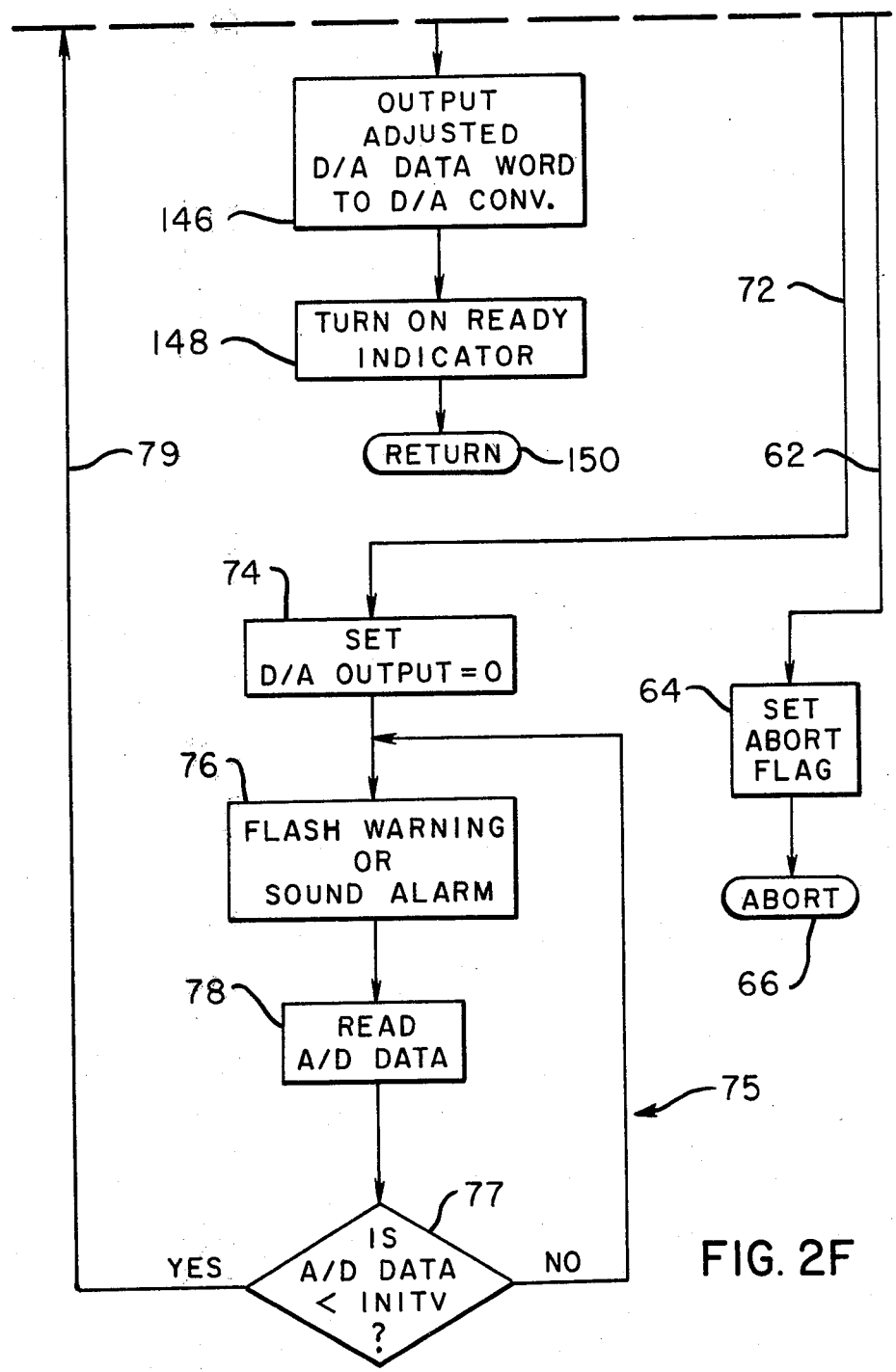

After the above division operation, the value SUM (now the average SUM) is compared with warning limits LIM2 and LIM3, in decision block 132 (FIG. 2E). If it is found that the value SUM is either greater than LIM2 or less than LIM3 an ASCII character "A" is stored for future diagnostic purposes, as shown by block 134, in the error character memory location, but system operation continues. Setting of these two limits is somewhat arbitrary, and is dictated by the long-term aging drift characteristic of the circuitry. Typically, the limits might be set at the ten percent and ninety percent points of the digital-to-analog data word range. Hence, in the illustrated embodiment, suitable values are 225 decimal (E1 hexadecimal) for LIM2 and 25 decimal (19 hexadecimal) for LIM3.

If the value SUM passes the two limit tests of the block 132, the "No" exit is taken to block 136, where as ASCII SPACE (20 hexadecimal) character is stored in the error character memory location, to indicate an absence of error. It should be noted that this ASCII SPACE character, as well as all of the other error characters previously discussed, are of particular significance only in the illustrated embodiment, and that other characters or codes may be alternatively used, as appropriate.

The operation then proceeds to block 138, in which the SUM value is loaded into the digital-to-analog control register, thereby becoming the digital-to-analog data word.

In blocks 140, 142 and 144 (FIG. 2E), a final adjustment is made to the digital-to-analog data word. The null point of 0 voltage point of $E_o$, as read by the eight-bit analog-to-digital converter, is actually slightly less than 39 millivolts, corresponding to the converter's least-significant-bit resolution. The voltage $E_o$ may be adjusted closer to the actual 0 than the analog-to-digital converter is capable of detecting, by incrementing the digital-to-analog data word a suitable number of steps. It has been previously explained that the potentiometer 36 is initially adjusted such that the voltage $E_o$ decreases approximately 4 millivolts for each increment (i.e. an increase of 1) of the digital-to-analog data word. A final adjustment of the voltage $E_o$ is made in the loop comprised of blocks 142 and 144. It has been found by experience that an increment count DAJCT (or digital-to-analog adjustment count) of 8 gives good results in this respect. During extended system tests, the 0 adjustment has been consistently maintained within plus or minus 5 or 6 millivolts from true 0, which is less than a $\frac{1}{4}$ bit error in respect to the resolution of the analog-to-digital converter in the illustrated embodiment.

As shown in FIG. 2F, the adjusted digital-to-analog data word is outputted to the digital-to-analog converter in block 146, a READY indicator is turned on in block 148, and return to the System Executive Program is effected, as shown in block 150.

Below is a group of program listings in Intel 8080 assembly language for the system operations described above.

```
ISIS 8080 MACRO ASSEMBLER, V1. 1
SIGNATURE PAD ADJUSTMENT SBR (PADCK. SRC)

TITLE 'SIGNATURE PAD ADJUSTMENT SBR (PADCK. SRC)'

; THIS SUBROUTINE CORRECTS THE DRIFT OF THE ZERO
          OFFSET
        ; VOLTAGE OUTPUT OF THE SIGNATURE PAD CIRCUITRY...

; REFERENCED MEMORY LOCATIONS...
7ED9    LCW     EQU 7ED9H       ; LED CONTROL WORD
7EDD    TBLER   EQU 7EDDH       ; TABLE ERROR CHARACTER LOC.

; INPUT PORT ASSIGNMENTS...
0063    ADIN    EQU 63H         ; A/D DATA INPUT PORT

; OUTPUT PORT ASSIGNMENTS...
0062    DA      EQU 62H         ; D/A CONVERTER PORT
00E9    DISPL   EQU 0E9H        ; LED DISPLAY PORT

; REFERENCED UTILITY SUBROUTINES...
0F94    DELAY   EQU 0F94H       ; 1-MILLISECOND DELAY
057A    DLY250  EQU 057AH       ; 250-MILLISECOND DELAY
0F6A    SRDAH   EQU 0F6AH       ; SHIFT RIGHT DBL ARITH HL
```

; PROGRAM CONSTANTS...

```
0006   DCNT   EQU   6      ; DIVISION COUNT
000A   LIM1   EQU   10D    ; < 1 LSB TEST LIMIT
00E1   LIM2   EQU   225D   ; UPPER RANGE LIMIT
0018   LIM3   EQU   25D-1  ; LOWER RANGE LIMIT
```

; ********************************************
;
; START OF ROUTINE...
;

```
5980              ORG   5980H

PADCK:
5980  1E20        MVI   E,20H     ; LOAD LOOP COUNT
5982  210000      LXI   H,0000    ; CLEAR SUM REGISTER

OLOOP:
5985  AF          XRA   A         ; SET D/A OUTPUT TO 0
5986  2F          CMA
5987  D362        OUT   DA
5989  CD940F      CALL  DELAY     ; WAIT FOR AMPLIFIER TO
                                  ;  SETTLE
598C  3AB5A       LDA   INITV     ; GET INITIAL VALUE
598F  57          MOV   D,A       ; PUT IT IN PRIOR-VALUE
                                  ;  REGISTER
5990  3E50        MVI   A,'P'     ; LOAD ERROR CHARACTER
5992  32DD7E      STA   TBLER     ; STORE IT
5995  01FF00      LXI   B,00FFH   ; INITIALIZE D/A DATA
                                  ; WORD AND CLEAR REGIS-
                                  ; TER B

PLOOP:
5998  0C          INR   C         ; INCREMENT D/A DATA
                                  ;  WORD
5999  79          MOV   A,C       ; MOVE D/A DATA WORD
                                  ;  FOR OUTPUT
599A  2F          CMA             ; COMPLEMENT FOR BUS
                                  ;  INVERSION
599B  D362        OUT   DA        ; OUTPUT TO D/A CONVER-
                                  ;  TER
599D  FEFF        CPI   0FFH      ; END OF RANGE IF DATA
                                  ;  WORD IS MAX.
```

| | | | | |
|---|---|---|---|---|
| 599F | CA0E5A | JZ | ABORT | |
| 59A2 | CD455A | CALL | INPUT | ; GET NEW A/D DATA |
| 59A5 | BA | CMP | D | ; IS IT < PRIOR VALUE? |
| 59A6 | D2175A | JNC | ERROR | ; NO, PRESSURE'S ON TABLE |
| 59A9 | 57 | MOV | D,A | ; SET PRIOR VALUE = NEW VALUE |
| 59AA | 14 | INR | D | ; ADD TOLERANCE |
| 59AB | 14 | INR | D | ; AGAIN, |
| 59AC | 14 | INR | D | ; AND AGAIN |
| 59AD | B7 | ORA | A | ; A/D OUTPUT > 0? |
| 59AE | C29859 | JNZ | PLOOP | ; YES, INCREASE D/A OUTPUT |
| 59B1 | 3E0A | MVI | A,LIM1 | ; TEST FOR < 1 LSB |
| 59B3 | B9 | CMP | C | ; IS D/A DATA WORD < LIM1? |
| 59B4 | D2115A | JNC | BAD | ; YES, HARDWARE FAILURE? |
| 59B7 | 09 | DAD | B | ; SUM D/A DATA WORD |

INITN:

| | | | | |
|---|---|---|---|---|
| 59B8 | 3EFF | MVI | A,0FFH | ; SET D/A OUTPUT TO FULL SCALE |
| 59BA | 2F | CMA | | |
| 59BB | D362 | OUT | DA | |
| 59BD | CD940F | CALL | DELAY | ; WAIT FOR AMPLIFIER TO SETTLE |
| 59C0 | 3E4E | MVI | A,'N' | ; LOAD ERROR CHARACTER |
| 59C2 | 32DD7E | STA | TBLER | ; STORE IT |
| 59C5 | 010000 | LXI | B,0000H | ; INITIALIZE D/A DATA WORD AND CLEAR REGISTER B |

NLOOP:

| | | | | |
|---|---|---|---|---|
| 59C8 | 0D | DCR | C | ; DECREMENT D/A DATA WORD |
| 59C9 | CA0E5A | JZ | ABORT | ; FAILURE IF WORD GOES TO 0 |
| 59CC | 79 | MOV | A,C | ; MOVE FOR OUTPUT |
| 59CD | 2F | CMA | | ; COMPLEMENT FOR DATA BUS INVERSION |
| 59CE | D362 | OUT | DA | ; OUTPUT TO D/A CONVERTER |

```
59D0 CD455A        CALL INPUT    ; GET NEW A/D DATA
59D3 B7            ORA  A        ; SET STATUS FLAGS
59D4 CAC859        JZ   NLOOP    ; LOOP IF A/D DATA IS
                                   ZERO
59D7 09            DAD  B        ; SUM D/A DATA WORD
59D8 1D            DCR  E        ; DECREMENT LOOP COUNT
59D9 C28559        JNZ  OLOOP    ; CONTINUE IF COUNT > 0

59DC 1E06          MVI  E,DCNT   ; LOAD DIVISION COUNT

DVD:
59DE CD6A0F        CALL SRDAH    ; SHIFT HL RIGHT ARITH-
                                   METIC
59E1 1D            DCR  E        ; DECREMENT COUNT
59E2 C2DE59        JNZ  DVD
     ; THE FOLLOWING SEGMENT TESTS THE D/A DATA WORD
     ; TO DETERMINE IF ITS VALUE FALLS BETWEEN THE
     ; LIMITS, LIM2 AND LIM3. IF SO, AN ASCII SPACE
     ; CHARACTER IS STORED IN THE 'TBLER' MEMORY
     ; LOCATION. IF ITS VALUE IS EITHER GREATER THAN
     ; LIM2 OR LESS THAN LIM3, THEN AN ASCII 'A'
     ; CHARACTER IS STORED IN 'TBLER', MEANING THAT
     ; THE SIGNATURE PAD CIRCUITRY SHOULD BE ADJUSTED
     ; AT EARLIEST CONVENIENCE. THIS ERROR IS NON-
     ; FATAL, BUT IT DOES INDICATE THAT ATTENTION IS
     ; NECESSARY.

TEST:
59E5 2641          MVI  H,'A'    ; LOAD ERROR CHR INTO H
59E7 3EE1          MVI  A,LIM2   ; IS D/A DATA WORD >
                                   LIM2?
59E9 BD            CMP  L
59EA DAF559        JC   STRCHR   ; YES, IF CARRY
59ED 3E18          MVI  A,LIM3   ; IS D/A DATA WORD <
                                   LIM3?
59EF BD            CMP  L
59F0 D2F559        JNC  STRCHR   ; YES, IF NO CARRY
59F3 2620          MVI  H,' '    ; NO, LOAD SPACE INTO H

STRCHR:
59F5 7C            MOV  A,H      ; COPY ERROR CHR TO
                                   ACCUM.
```

```
59F6 32DD7E          STA   TBLER    ; AND STORE IT

; NEXT, THE OFFSET IS ADJUSTED TO APPROXIMATELY
; 0 BY INCREASING THE D/A OUTPUT A SPECIFIED NUM-
; BER OF STEPS...

59F9 3A4A5A          LDA   DAJCT    ; GET ADJUST COUNT

DOWN:
59FC 2C              INR   L        ; INCREMENT D/A CONTROL
                                      REGISTER
59FD 3D              DCR   A        ; DECREMENT D/A ADJUST
                                      COUNT
59FE C2FC59          JNZ   DOWN     ; CONTINUE UNTIL COUNT
                                      = 0
5A01 7D              MOV   A,L      ; OUTPUT D/A DATA WORD
5A02 2F              CMA
5A03 D362            OUT   DA

EXIT1:
5A05 3AD97E          LDA   LCW      ; GET LED CONTROL WORD
5A08 E6DF            ANI   0DFH     ; TURN ON 'SIGN' LED
5A0A D3E9            OUT   DISPL    ;   "    "   "    "
5A0C AF              XRA   A        ; CLEAR ACCUM. (ABORT
                                      FLAG)
5A0D C9              RET            ; RETURN TO CALLING
                                      ROUTINE

ABORT:
5A0E 3EFF            MVI   A,0FFH   ; SET ABORT FLAG (IN
                                      ACCUM.)
5A10 C9              RET            ; AND RETURN TO CALLING
                                      ROUTINE

BAD:
5A11 3E4C            MVI   A,'L'    ; STORE ERROR CHARACTER
5A13 32DD7E          STA   TBLER
5A16 C9              RET            ; RETURN TO CALLING
                                      ROUTINE
```

```
            ERROR:
5A17 AF             XRA   A         ; SET D/A OUTPUT TO Ø
5A18 2F             CMA
5A19 D362           OUT   DA
5A1B CD94ØF         CALL  DELAY     ; WAIT FOR AMPLIFIER
                                      TO SETTLE
5A1E 3A4B5A         LDA   INITV     ; GET INITIAL VALUE
5A21 57             MOV   D,A       ; PUT IT IN PRIOR VALUE
                                      REGISTER
5A22 2EØØ           MVI   L,ØØ      ; LOAD INITIAL LCW

ERR1:
5A24 1EØ4           MVI   E,Ø4H     ; SET LOOP COUNT

ERR2:
5A26 7D             MOV   A,L       ; PUT LCW IN ACCUM.
5A27 D3E9           OUT   DISPL     ; OUTPUT TO KEYPD LED'S
5A29 CD7AØ5         CALL  DLY25Ø    ; TIME OUT
5A2C EEFC           XRI   ØFCH      ; REVERSE LCW BITS 2-7
5A2E 6F             MOV   L,A       ; SAVE NEW LCW
5A2F CD455A         CALL  INPUT     ; GET A/D DATA
5A32 BA             CMP   D         ; < INIT. VALUE?
5A33 D2245A         JNC   ERR1      ; NO--LOOP
5A36 B7             ORA   A         ; SET STATUS FLAGS
5A37 CA245A         JZ    ERR1      ; RINGING IF A/D DATA
                                      = Ø
5A3A 1D             DCR   E         ; DECREMENT LOOP COUNT
5A3B C2265A         JNZ   ERR2      ; CONTINUE UNTIL COUNT
                                      = Ø
5A3E 3EFC           MVI   A,ØFCH    ; LOAD TURNOFF LCW
5A4Ø D3E9           OUT   DISPL     ; TURNOFF ALL LED'S
5A42 C38Ø59         JMP   PADCK     ; GO RESTART THE ROUTINE

INPUT:
5A45 FB             EI              ; ENABLE INTERRUPT
5A46 76             HLT             ; WAIT FOR INTERRUPT
5A47 DB63           IN    ADIN      ; GET A/D DATA
5A49 C9             RET

; DATA AREAS...
5A4A Ø8    DAJCT:   DB    Ø8H       ; D/A ADJUST COUNT
5A4B ØA    INITV:   DB    ØAH       ; INITIAL VALUE
```

5980                END  PADCK    ; RMW

| | | | | | | | |
|---|---|---|---|---|---|---|---|
| ABORT | 5A0E | ADIN | 0063 | BAD | 5A11 | DA | 0062 |
| DAJCT | 5A4A | DCNT | 0006 | DELAY | 0F94 | DISPL | 00E9 |
| DLY25 | 057A | DOWN | 59FC | DVD | 59DE | ERR1 | 5A24 |
| ERR2 | 5A26 | ERROR | 5A17 | EXIT1 | 5A05 | INITN | 59B8 |
| INITV | 5A4B | INPUT | 5A45 | LCW | 7ED9 | LIM1 | 000A |
| LIM2 | 00E1 | LIM3 | 0018 | NLOOP | 59C8 | OLOOP | 5985 |
| PADCK | 5980 | PLOOP | 5998 | SRDAH | 0F6A | STRCH | 59F5 |
| TBLER | 7EDD | TEST | 59E5 | | | | |

ISIS 8080 MACRO ASSEMBLER, V1.1
UTILITY SUBROUTINES REFERENCED BY PADCK.SRC

```
                TITLE  'UTILITY SUBROUTINES REFERENCED BY
                        PADCK.SRC'

; BRANCH TABLE ADDRESSES...
0F6A                    ORG     0F6AH
0F6A C39A06             JMP     SRDAH
0F94                    ORG     0F94H
0F94 C38605             JMP     DELAY

; UTILITY SUBROUTINES
057A                    ORG     057AH
                DLY250:
057A C5                 PUSH    B           ; SAVE B&C REGIS-
                                              TERS
057B 06FA               MVI     B,250D      ; LOAD LOOP COUNT
                DLYLP:
057D CD8605             CALL    DELAY       ; CALL 1-MS DELAY
                                              SBR
0580 05                 DCR     B           ; DECREMENT LOOP
                                              COUNT
0581 C27D05             JNZ     DLYLP       ; CONTINUE UNTIL
                                              COUNT = 0
0584 C1                 POP     B           ; RESTORE B&C REGIS-
                                              TERS
0585 C9                 RET                 ; DONE
                DELAY:
0586 C5                 PUSH    B           ; SAVE B&C REGIS-
                                              TERS
```

```
Ø587 Ø688           MVI     B,136D      ; LOAD LOOP COUNT
            DLY1LP:
Ø589 Ø5             DCR     B           ; DECREMENT LOOP
                                          COUNT
Ø58A C289Ø5         JNZ     DLY1LP      ; CONTINUE UNTIL
                                          COUNT = Ø
Ø58D C1             POP     B           ; RESTORE B&C REGIS-
                                          TERS
Ø58E C9             RET                 ; DONE
Ø69A                ORG     Ø69AH

; SHIFT RIGHT DOUBLE ARITHMETIC REGISTER
              PAIR HL...
            SRDAH:
Ø69A F5             PUSH    PSW
Ø69B 7C             MOV     A,H
Ø69C Ø7             RLC
Ø69D 1F             RAR
Ø69E 1F             RAR
Ø69F 67             MOV     H,A
Ø6AØ 7D             MOV     A,L
Ø6A1 1F             RAR
Ø6A2 6F             MOV     L,A
Ø6A3 F1             POP     PSW
Ø6A4 C9             RET

ØØØØ                END                 ; RMW

DELAY Ø586    DLY1L Ø589    DLY25 Ø57A    DLYLP Ø57D
SRDAH Ø69A
```

While the form of the invention illustrated and described herein is particularly adapted to fulfill the objects aforesaid, it is to be understood that other and further modifications within the scope of the following claims may be made without departing from the spirit of the invention.

What is claimed is:

1. Apparatus for compensating for drift from a null point of a measuring device comprising:
   comparison means for comparing a first signal from said measuring device with a derived second signal and for providing an output signal representative of the difference between said first and second signals;
   analog-to-digital converter means to which said output signal is applied, for providing a digital equivalent of said output signal;
   digital-to-analog converter means for providing said second signal to said comparison means; and
   data processing means coupled to said analog-to-digital converter means and to said digital-to-analog converter means, and operable in an iterative operation to generate a compensating value which, when applied to said digital-to-analog converter means, results in said second signal having a predetermined relationship to said first signal, said compensating value being generated in a plurality of iterations commencing from a predetermined initial value by incrementing said digital-to-analog converter means to change the magnitude of said second signal until said output signal applied to said analog-to-digital converter means by said comparison means attains a predetermined value.

2. The apparent of claim 1 in which an average compensating value corresponding to said second signal is determined by ascertaining a compensating value corresponding to said second signal a predetermined number of times, summing said values, and taking an average thereof.

3. The apparatus of claim 1 in which at least a pair of iterative operations are performed by said data processing means to obtain compensating values to compensate for drift in both positive and negative directions.

4. The apparatus of claim 3 in which all of said compensating values are averaged to determine an average compensating value.

5. The apparatus of claim 1 in which said comparison means is an operational amplifier.

6. The apparatus of claim 1 in which the predetermined value to be attained by the output signal is approximately zero.

7. The apparatus of claim 1 in which the predetermined relationship to be attained between said first and second signals is approximate equality.

8. Apparatus for compensating for drift from a null point of a measuring device comprising:
   comparison means for comparing a measurement output signal from said measuring device in a no-load condition with a compensating signal and for providing a comparison output signal representative of the difference between said measurement output and compensating signals;
   analog-to-digital converter means to which said comparison output signal is applied, for providing a digital equivalent of said comparison output signal;
   digital-to-analog converter means coupled to said comparison means for providing said compensating signal thereto; and
   data processing means coupled to said analog-to-digital converter means and to said digital-to-analog converter means, said data processing means including first storage means for storing a first amount representing the digital equivalent of the previous value of said comparison output signal, second storage means for storing the digital equivalent of the compensating signal, comparing means for comparing the digital equivalent of the comparison output signal with the digital equivalent of the previous value, and incrementing means controlled by the comparing means and capable of incrementing the digital equivalent of the compensating signal to cause said digital-to-analog converter means to provide a modified compensating signal.

9. The apparatus of claim 8, in which said data processing means also includes third storage means for storing a count amount, operating means for causing said data processing means to operate a given number of times to produce a plurality of digital equivalent values of the compensating signal; summing means for summing all of said digital equivalent values; and averaging means for producing an average digital equivalent value.

10. The apparatus of claim 8, also including means for detecting an error condition and terminating operation of the apparatus when such error condition is detected.

11. The apparatus of claim 8 in which the digital equivalent of the compensating signal may be initially set to either one of two different values to enable said apparatus to provide two different sets of compensating values.

12. The apparatus of claim 8 in which the comparison means is an operational amplifier.

13. A method for compensating for drift from a null point of a measuring device comprising the steps of:
   (a) comparing a measurement output signal from said measuring device with a compensating signal;
   (b) providing a comparison output signal representative of the difference between said measurement output signal and said compensating signal;
   (c) comparing said comparison output signal with a previous comparison output signal;
   (d) modifying the compensating signal by a predetermined amount in the event of a given result of the comparison of step (c); and
   (e) repeating steps (a) to (d) inclusive with successive modifications of said compensating signal until said comparison output signal attains a predetermined value.

14. The method of claim 13 in which the predetermined value of step (e) is approximately zero.

15. The method of claim 13, also including the following additional steps:
   (f) repeating steps (a) to (e) inclusive a predetermined number of times;
   (g) summing the values of the compensating signal derived from the series of operations of steps (a) to (e) inclusive; and
   (h) taking an average of said summed values to provide an average compensating signal which may be used during subsequent operations of the measuring device to compensate for drift from the null point thereof.

16. The method of claim 13 which also includes an initial step of providing an initial compensating signal having a selected one of two different values, to provide two different compensating signals.

17. A method for compensating for drift from a null point of a measuring device in a no-load condition comprising the steps of:
   (a) setting a compensating digital value to a predetermined amount;
   (b) deriving an analog compensating signal from said compensating digital value;
   (c) comparing a measurement analog signal from said measuring device with said analog compensating signal;
   (d) providing an output analog signal representative of the difference between said measurement and compensating signals;
   (e) converting said output analog signal to a digital value;
   (f) comparing said digital value of said output signal to a prior value of said output signal;
   (g) incrementing said compensating digital value by a predetermined amount in the event of a given result of said comparison;
   (h) deriving an updated analog compensating signal from said compensating digital value; and
   (i) repeating steps (a) to (h) inclusive with successive incrementations of said digital value and corresponding alterations of the magnitude of said analog compensating signal until said output analog signal attains a predetermined value.

18. The method of claim 17 in which the predetermined value of step (i) is approximately zero.

19. The method of claim 17, also including the following additional steps:
   (j) repeating steps (a) and (i) inclusive a predetermined number of times;
   (k) summing the compensating digital values derived from the series of operations of steps (a) to (i) inclusive; and
   (l) taking an average of said summed values to derive an average compensating digital value for conversion to an analog compensating signal which may be used during subsequent operations of the measuring device to compensate for drift from the null point thereof.

20. The method of claim 17 in which the compensating digital amount set in step (a) may be set to a first value to obtain a first set of compensating values and may alternatively be set to a second value to obtain a second set of compensating values.

21. The method of claim 20, also including the following additional steps:
 (j) repeating steps (a) to (i) inclusive a predetermined number of times commencing with the compensating digital amount set in step (a) to a first value to obtain a plurality of said first sets of compensating values;
 (k) repeating steps (a) to (i) inclusive a predetermined number of times commencing with the compensating digital amount set in step (a) to a second value to obtain a plurality of said second sets of compensating values;
 (l) summing together all of the compensating digital values derived from the operations of steps (j) and (k); and
 (m) taking an average of said summed values to derive an average compensating digital value for conversion to an analog compensating signal which may be used during subsequent operations of the measuring device to compensate for drift from the null point thereof.

22. The method of claim 21, also including the step of increasing the derived average compensating digital value by a predetermined amount to further reduce the deviation of said output analog signal from zero.

* * * * *